United States Patent
Qiu et al.

(10) Patent No.: US 11,495,651 B2
(45) Date of Patent: Nov. 8, 2022

(54) MULTI-PAGE DISPLAY SCREEN AND MOBILE PHONE INCLUDING THE SAME

(71) Applicants: CHENGDU BOE OPTOELECTRONICS TECHNOLOGY CO., LTD., Sichuan (CN); BEIJING BOE TECHNOLOGY DEVELOPMENT CO., LTD., Beijing (CN)

(72) Inventors: Haijun Qiu, Beijing (CN); Guoqiang Ma, Beijing (CN); Yao Hu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 692 days.

(21) Appl. No.: 16/330,827

(22) PCT Filed: Aug. 1, 2018

(86) PCT No.: PCT/CN2018/097985
§ 371 (c)(1),
(2) Date: Mar. 6, 2019

(87) PCT Pub. No.: WO2019/085559
PCT Pub. Date: May 9, 2019

(65) Prior Publication Data
US 2021/0327989 A1    Oct. 21, 2021

(30) Foreign Application Priority Data
Oct. 31, 2017 (CN) .......................... 201711047717.1

(51) Int. Cl.
*H01L 27/32* (2006.01)
*G09G 3/00* (2006.01)
(Continued)

(52) U.S. Cl.
CPC ......... *H01L 27/3267* (2013.01); *G09G 3/035* (2020.08); *H01L 25/0657* (2013.01);
(Continued)

(58) Field of Classification Search
CPC . H01L 27/3267; H01L 25/0657; H01L 25/18; H01L 2251/5338;
(Continued)

(56) References Cited

U.S. PATENT DOCUMENTS

2014/0029190 A1* 1/2014 Sato ...................... G06F 1/1641
361/679.27
2014/0213324 A1   7/2014 Tan et al.
(Continued)

FOREIGN PATENT DOCUMENTS

| CN | 103985315 A | 8/2014 |
| CN | 106686160 A | 5/2017 |

(Continued)

OTHER PUBLICATIONS

PCT International Search Report, Application No. PCT/CN2018/097985, dated Oct. 16, 2018, 6 pages: with English translation.
(Continued)

*Primary Examiner* — Alexander Eisen
*Assistant Examiner* — Kebede T Teshome
(74) *Attorney, Agent, or Firm* — Armstrong Teasdale LLP

(57) ABSTRACT

The disclosure provides a multi-page display screen and a mobile phone including the same. The multi-page display screen includes a first display sub-screen and a second display sub-screen formed by flexible screens. The first display sub-screen and the second display sub-screen each
(Continued)

includes a first half screen and a second half screen. The first half screen and the second half screen are pivotable and foldable relative to each other, and the first half screen and the second half screen can be unfolded relative to each other to constitute the first display sub-screen and the second display sub-screen respectively. Backs of the first half screens of the first display sub-screen and in the second display sub-screen are bonded together, such that the first display sub-screen and the second display sub-screen are arranged as book pages. The multi-page display screen makes it easy to switch to a page of a different mode.

10 Claims, 1 Drawing Sheet

(51) Int. Cl.
    *H01L 25/065*     (2006.01)
    *H01L 25/18*     (2006.01)
    *H04M 1/02*     (2006.01)
(52) U.S. Cl.
    CPC .......... *H01L 25/18* (2013.01); *H04M 1/0214* (2013.01); *H04M 1/0268* (2013.01); *G09G 2330/026* (2013.01); *G09G 2330/027* (2013.01); *G09G 2354/00* (2013.01); *H01L 2225/06558* (2013.01); *H01L 2251/5338* (2013.01)
(58) Field of Classification Search
    CPC ...... H01L 2225/06558; H04M 1/0214; H04M 1/0268; G09G 3/035; G09G 2354/00; G09G 2330/027; G09G 2330/026
    See application file for complete search history.

(56) References Cited

U.S. PATENT DOCUMENTS

| | | | | |
|---|---|---|---|---|
| 2014/0331781 | A1* | 11/2014 | Lee | ........................ G06F 1/1626 |
| | | | | 73/849 |
| 2015/0255023 | A1* | 9/2015 | Lee | ........................ G06F 1/1681 |
| | | | | 345/204 |
| 2015/0338888 | A1* | 11/2015 | Kim | ........................ G06F 1/1652 |
| | | | | 345/156 |
| 2016/0181346 | A1* | 6/2016 | Kwon | ................ H01L 27/3262 |
| | | | | 257/40 |
| 2016/0246559 | A1* | 8/2016 | Jung | ........................ G06F 1/169 |

FOREIGN PATENT DOCUMENTS

| | | |
|---|---|---|
| CN | 107613058 A | 1/2018 |
| CN | 207399277 U | 5/2018 |

OTHER PUBLICATIONS

PCT Written Opinion, Application No. PCT/CN2018/097985, dated Oct. 16, 2018, 5 pages.: with English translation of relevant part.
China First Office Action, Application No. 201711047717.1, dated May 8, 2019, 13 pps.: with English translation.

* cited by examiner

MULTI-PAGE DISPLAY SCREEN AND MOBILE PHONE INCLUDING THE SAME

CROSS REFERENCE TO RELATED APPLICATIONS

This patent application is a National Stage Entry of PCT/CN2018/097985 filed on Aug. 1, 2018, which claims the benefit and priority of Chinese Patent Application No. 201711047717.1 filed on Oct. 31, 2017, the disclosures of which are hereby incorporated by reference herein in their entirety as part of the present application.

BACKGROUND

The present disclosure relates to a display screen, and in particular to a foldable multi-page display screen. The disclosure also relates to a mobile phone including the multi-page display screen.

Flexible Amoled screen is a single-pixel light-emitting flexible display screen with very high contrast ratio. This flexible display screen can be folded at any angle. Thus, it can be folded when it is not in use to save space, while unfolded when it is in use to increase the display area.

At present for mobile phones, regarding different operation modes or different SIM cards, software is usually used for switching between the modes or cards, and the switch operation is rather troublesome. During the switch operation, when a first display page corresponding to a first operation mode is switched to a second display page corresponding to a second operation mode, the first display page is replaced by the second display page in a same display area. Applications corresponding to the first operation mode are turned off, or applications corresponding to the first operation mode and second operation mode are displayed simultaneously in a same display area. The applications in the first operation mode and the applications in the second operation mode cannot be displayed in different display areas.

BRIEF DESCRIPTION

To overcome all or part of the above defects, embodiments of the present disclosure provide a foldable display screen enabling multi-page display based on a flexible Amoled screen. This multi-page display screen includes multiple different foldable display sub-screens. When the display screen according to embodiments of the present disclosure is applied to a mobile phone, the multiple different display sub-screens according to embodiments of the present disclosure may be corresponding to different display modes or different SIM cards respectively.

One aspect of the present disclosure provides a multi-page display screen, including a first display sub-screen and a second display sub-screen formed by flexible screens. The first display sub-screen and the second display sub-screen each include a first half screen and a second half screen. The first half screen and the second half screen are pivotable and foldable relative to each other, and the first half screen and the second half screen can be unfolded relative to each other. Backs of the first half screens of the first display sub-screen and of the second display sub-screen are bonded together, such that the first display sub-screen and the second display sub-screen are arranged as book pages.

The multi-page display screen according to the present disclosure may have the following advantages.

In at least one embodiment, the flexible screen is a flexible oled screen, especially an Amoled screen.

In at least one embodiment, backs of the first half screens are bonded together with optical adhesive.

In at least one embodiment, the second half screens are combined with a middle frame, and the middle frame is disposed on backs of the second half screens of the first display sub-screen and of the second display sub-screen and embraces the first display sub-screen and the second display sub-screen as a book cover.

In at least one embodiment, a COP (chip on plastic) bending technique or a COF (chip on film) bending technique is used on ends of the second half screens to bend electronic chips to the backs of the second half screens and hide the electronic chips in the middle frame.

In at least one embodiment, the first display sub-screen and the second display sub-screen each is provided with a folding sensor, the folding sensor is configured to sense folding and unfolding of the first display sub-screen and the second display sub-screen respectively, thereby turning on/off the first display sub-screen and the second display sub-screen.

In at least one embodiment, the folding sensor is configured to have a metal wire, and resistance of the metal wire changes when the first display sub-screen or the second display sub-screen is folded or unfolded, thereby the folding sensor senses folding and unfolding of the first display sub-screen or the second display sub-screen.

In at least one embodiment, each of the first display sub-screen and the second display sub-screen includes a virtual touch button or a physical button which is used to control turning on/off the first display sub-screen and the second display sub-screen respectively, and/or each of the first half screen and the second half screen of the first display sub-screen and the second display sub-screen includes a virtual touch button or a physical button which is used to control turning on/off the first half screen and the second half screen of the first display sub-screen and the second display sub-screen respectively.

In another aspect, the present disclosure further relates to a mobile phone, and the mobile phone includes a multi-page display screen as described above.

The mobile phone according to the present disclosure may have the following advantages.

In at least one embodiment, the first display sub-screen and the second display sub-screen are corresponding to a first SIM card and a second SIM card installed in the mobile phone respectively, or corresponding to a first operation mode and a second operation mode in the mobile phone respectively.

The multi-page display screen according to the present disclosure is configured to include two display sub-screens arranged as book pages form based on a foldable flexible screen, thereby different display sub-screens may be corresponding to different operation modes or different SIM cards in operation. On this basis, applications under different operation modes or different SIM cards can be displayed in two display sub-screens respectively.

DETAILED DESCRIPTION

A multi-page display screen, a mobile phone structure including the multi-page display screen, and various other aspects in embodiments according to the present disclosure will be described below with reference to the drawings. Many particular details are described below to make persons skilled in the art understand the present disclosure comprehensively. However, it is obvious for those skilled in the art that implementation of the present disclosure may not concern some of the details. In addition, it is should be understood that the present disclosure is not limited to the described specific embodiments. On the contrary, it may be considered that the present disclosure should be implemented with any combination of the features and factors below, despite whether they relate to different embodiments. Therefore, unless explicitly described in the claims, the aspects, features, embodiments, and advantages below are only used for description, but shall not be considered as factors or limiting of the claims.

Figure 1:
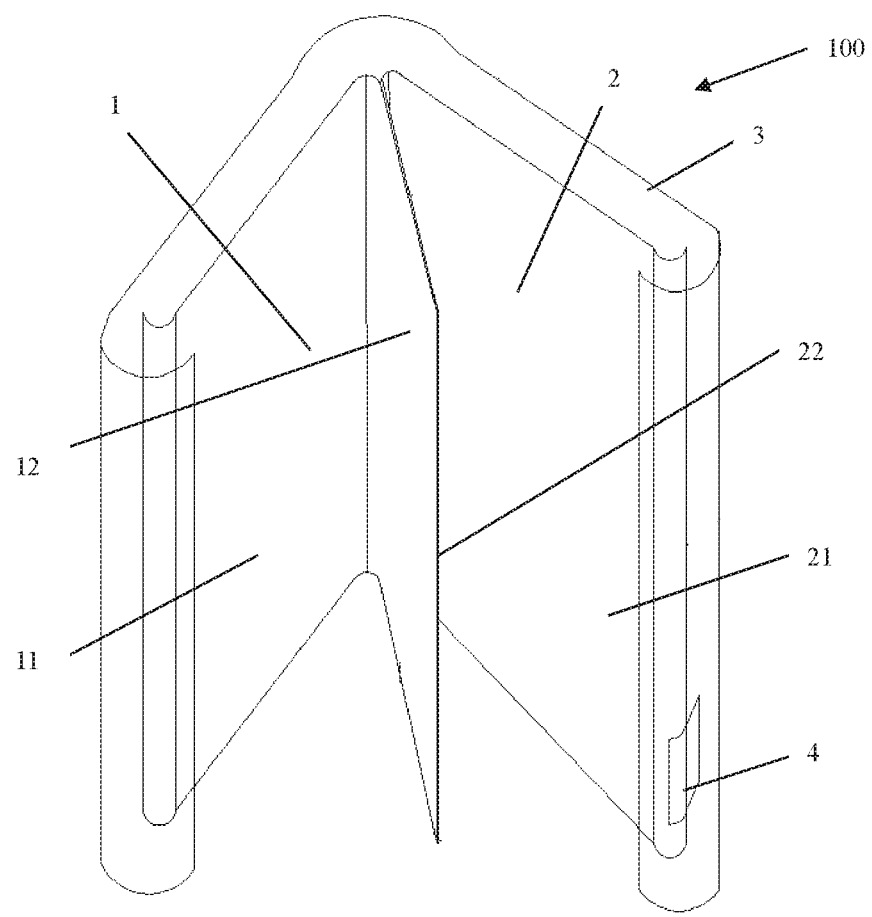
FIG. 1 is a perspective view of a multi-page display screen according to the present disclosure.
Figure 2:
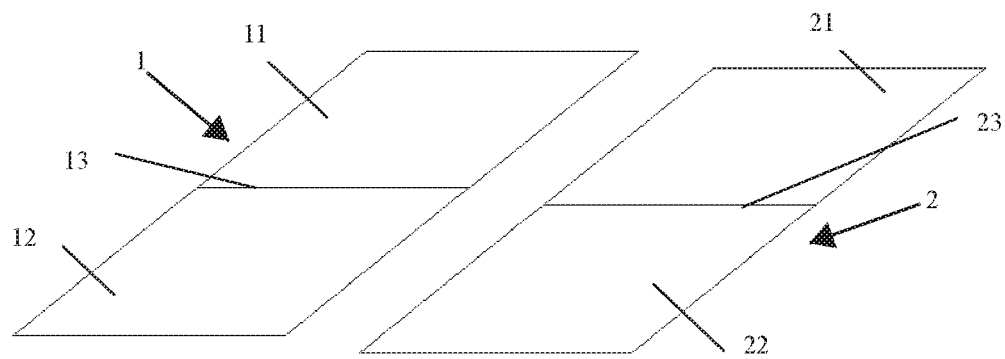
FIG. 2 is a perspective view of two display sub-screens before bonding.

A multi-page display screen 100 according to an example embodiment of the present disclosure is shown in FIG. 1. As shown in FIG. 1, the multi-page display screen 100 includes a first display sub-screen 1 and a second display sub-screen 2. The first display sub-screen 1 and the second display sub-screen 2 are both composed of a Flexible Amoled screen, which makes both of the first display sub-screen 1 and the second display sub-screen 2 foldable. That is, the first display sub-screen 1 can be folded along an axis 13 shown in FIG. 2, and the second display sub-screen 2 can be folded along an axis 23 shown in FIG. 2. It is conceivable that the first display sub-screen 1 and the second display sub-screen 2 may be also formed by other foldable flexible screens, but not limited to the Flexible Amoled screen. The first axis 13 is arranged on the first display sub-screen 1 to divide the first display sub-screen 1 into a first half screen 11 and a second half screen 12. The second axis 23 is arranged on the second display sub-screen 2 to divide the second display sub-screen 2 into a first half screen 21 and a second half screen 22. The first half screen 11 and the second half screen 12 are pivotable and foldable relative to each other along the first axis 13. The first half screen 21 and the second half screen 22 are pivotable and foldable relative to each other along the second axis 23. In example embodiments shown in the drawings, the first half screens 11, 21 and the second half screens 12, 22 have exactly the same size, such that the first half screens 11, 21 thoroughly coincide with the second half screens 12, 22 respectively when they are folded. However, it is conceivable that the first half screens 11, 21 may have a different size from the second half screens 12, 22. For example, widths of the first half screens 11, 21 are both less than widths of the second half screens 12, 22, in which case, the second half screens 12, 22 do not fully cover the first half screens 11, 21 when they are folded. Backs of the first half screens 11 of the first display sub-screen 1 and the first half screens 21 of the second display sub-screen 2 are bonded together, such that the first display sub-screen 1 and the second display sub-screen 2 are arranged as book pages. When the first display sub-screen 1 is used, the first half screen 11 and the second half screen 12 of the first display sub-screen 1 are unfolded, while the first half screen 21 and the second half screen 22 of the second display sub-screen 2 are folded together. When the second display sub-screen 2 is used, inverse operations are performed. Obviously, that backs of the first half screens 11, 21 are folded together requires that the first half screens 11, 21 have exactly the same size.

Backs of the first half screens 11, 21 are bonded together by an optical adhesive. The optical adhesive is characterized by colorless transparency, high light transmittance, good bonding strength, being curable at room or medium temperature and low curing shrinkage. As show in FIG. 2, the second half screens 12, 22 are both combined with a middle frame 3, the middle frame functions as a book cover. In particular, the middle frame is disposed on both backs of the second half screens of the first display screen and the second display and embraces the first display sub-screen and the second display sub-screen as a book cover. In an example embodiment, a COP (chip on plastic) bending technique or a COF (chip on film) bending technique is used on ends of the second half screen 12, 22 to bend electronic chips to the backs of the second half screens and hide them in the middle frame 3. When the COP bending technique or COF bending technique is used, flexible printed circuit boards (FPC) 4 are used on end faces of the second half screens 12, 22. The COP bending technique and COF bending technique can advantageously reduce width of the frame.

In at least one example embodiment, the first display sub-screen 1 and the second display sub-screen 2 each is provided with a folding sensor (not shown). The folding sensor is configured to sense folding and unfolding of the first display sub-screen 1 and the second display sub-screen 2 respectively, thereby turning on/off of the first display sub-screen 1 and the second display sub-screen 2. Further, the folding sensor is configured to have a metal wire. When the first display sub-screen or the second display sub-screen is unfolded or folded resistance of the metal wire is changed due to connection or disconnection of the metal wire. Based on this, the folding sensor senses unfolding and folding of the first display sub-screen or the second display sub-screen. In one embodiment, the metal wire is arranged along an edge of the first display sub-screen 1 or the second display sub-screen 2.

In at least one embodiment, each of the first display sub-screen and the second display sub-screen includes a virtual touch button or a physical button, and the virtual touch button or the physical button is used to control turning on/off the first display sub-screen 1 and the second display sub-screen 2. Optionally, each of the first half screen and the second half screen of the first display sub-screen and the second display sub-screen includes a virtual touch button or a physical button, and the virtual touch button or the physical button is employed to control turning on/off the first half screen and the second half screen of the first display sub-screen and the first half screen and the second half screen in of the first display sub-screen of the second display sub-screen respectively. It is conceivable that the above-described folding sensor may be combined with the virtual touch button or the physical button in a conceivable manner. For example, when the first/second display sub-screen is unfolded, the folding sensor first senses the unfolding of the first/second display sub-screen to control turning on the first half screen and the second half screen of the first/second display sub-screen, and then a user may control turning on/off the first half screen and the second half screen via the virtual touch button or the physical button.

When installed in a mobile phone, the first display sub-screen 1 and the second display sub-screen 2 may be corresponding to different operation modes in the mobile phone respectively. For example, the first display sub-screen 1 is corresponding to an operation mode, while the second display sub-screen 2 is corresponding to a relaxation mode. In the operation mode, applications related to work are activated while applications related to entertainment cannot be activated. In the relaxation mode, applications related to entertainment are activated. The first display sub-screen and the second display sub-screen may also be corresponding to the first SIM card and the second SIM card installed in the mobile phone respectively. In this case, it is unnecessary to choose a mode or a SIM card in related software, and a simple flip of the display screens enables switching between operation modes and SIM cards. Furthermore, applications corresponding to different operation modes or different SIM cards may be displayed in different display areas, i.e., the first display sub-screen 1 and the second display sub-screen 2, and switching between the operation modes and SIM cards are very easy.

The multi-page display screen according to the present disclosure can be installed in a mobile phone, and it is conceivable that the multi-page display screen according to the present disclosure can be installed not only in a mobile phone, but also in other electronic products, e.g., a tablet PC.

The present disclosure is disclosed in example embodiments above, but the present disclosure is not limited thereto. Any variation or modification made by a person skilled in the art without departure from the spirit and scope of the present disclosure shall be included in the protection scope of the present disclosure. Therefore, the protection scope of the present disclosure shall be determined by the protection scope of the claims.

What is claimed is:

1. A multi-page display screen, comprising a first display sub-screen and a second display sub-screen formed by flexible screens, wherein the first display sub-screen and the second display sub-screen each comprises a first half screen and a second half screen, wherein the first half screen and the second half screen are pivotable and foldable relative to each other, wherein the first half screen and the second half screen can be unfolded relative to each other, and wherein a back surface of the first half screen of the first display sub-screen and a back surface of the first half screen of the second display sub-screen are bonded together.

2. The multi-page display screen according to claim 1, wherein the flexible screens are flexible oled screens.

3. The multi-page display screen according to claim 1, wherein the back surface of the first half screen of the first display sub-screen and the back surface of the first half screen of the second display sub-screen are bonded together by an optical adhesive.

4. The multi-page display screen according to claim 1, wherein the second half screens are combined with a middle frame, and wherein the middle frame is disposed on a back surface of the second half screen of the first display sub-screen and on a back surface of the second half screen of the second display sub-screen and embraces the first display sub-screen and the second display sub-screen as a book cover.

5. The multi-page display screen according to claim 4, wherein one of a COP bending technique and a COF bending technique is used on ends of the second half screens to bend electronic chips to the back surfaces of the second half screens and to hide the electronic chips in the middle frame.

6. The multi-page display screen according to claim 1, wherein the first display sub-screen and the second display sub-screen each includes a folding sensor, which is configured to sense folding and unfolding of the first display sub-screen and the second display sub-screen respectively, in order to turn on/off the first display sub-screen and the second display sub-screen.

7. The multi-page display screen according to claim 6, wherein the folding sensor has a metal wire, and wherein resistance of the metal wire changes when the first display sub-screen or the second display sub-screen is folded or unfolded, thereby enabling the folding sensor to sense unfolding and folding of the first display sub-screen or the second display sub-screen.

8. The multi-page display screen according to claim 1, wherein each of the first display sub-screen and the second display sub-screen comprises one of a virtual touch button and a physical button which is used to control turning on/off of the first display sub-screen and the second display sub-screen respectively, and wherein each of the first half screen and the second half screen of the first display sub-screen and of the second display sub-screen comprises one of a virtual touch button and a physical button which is used to control turning on/off the first half screen and the second half screen of the first display sub-screen and of the second display sub-screen respectively.

9. A mobile phone comprising the multi-page display screen according to claim 1.

10. The mobile phone according to claim 9, wherein the first display sub-screen and the second display sub-screen correspond to one of i) a first SIM card and a second SIM card installed in the mobile phone respectively, and ii) a first operation mode and a second operation mode in the mobile phone respectively.

* * * * *